US005633518A

United States Patent [19]
Broze

[11] Patent Number: 5,633,518
[45] Date of Patent: May 27, 1997

[54] NONVOLATILE REPROGRAMMABLE INTERCONNECT CELL WITH FN TUNNELING AND PROGRAMMING METHOD THEREOF

[75] Inventor: Robert U. Broze, Santa Cruz, Calif.

[73] Assignee: Zycad Corporation, Fremont, Calif.

[21] Appl. No.: 508,914

[22] Filed: Jul. 28, 1995

[51] Int. Cl.[6] .................................................. H01L 29/76
[52] U.S. Cl. ........................ 257/314; 257/316; 257/321; 365/185.1; 365/185.28
[58] Field of Search ........................... 257/321, 316, 257/314, 315, 318, 319; 365/185.01, 185.1, 185.14, 185.18, 185.28

[56] References Cited

U.S. PATENT DOCUMENTS

| | | | |
|---|---|---|---|
| 4,672,409 | 6/1987 | Takei et al. | 365/185.08 |
| 5,019,879 | 5/1991 | Chiu | 365/185.28 |
| 5,021,848 | 6/1991 | Chiu | 365/185.28 |
| 5,225,362 | 7/1993 | Bergemont | 437/43 |

FOREIGN PATENT DOCUMENTS

0573170  12/1993  European Pat. Off. ............ 257/321

*Primary Examiner*—Sara W. Crane
*Assistant Examiner*—David B. Hardy
*Attorney, Agent, or Firm*—Townsend and Townsend and Crew LLP

[57] ABSTRACT

An array of programmable interconnect cells, each cell having a floating gate as the gate of an MOS switch transistor which programmably connect or disconnects nodes, is used in an FPGA. The floating gate of each cell, which is capacitively coupled to a control gate, is programmed by Fowler-Nordheim tunneling through an tunneling oxide above a programming/erase line in the integrated circuit substrate. Contiguous and parallel to the programming/erase line is at least one tunneling control line which forms a PN junction in close proximity to the programming/erase line region under the tunneling oxide. Under a reverse bias, a deep charge depletion region is formed in the programming/erase line region to block tunneling. In this manner, a selected cell can be programmed/erased, while the non-selected cells are not.

30 Claims, 5 Drawing Sheets

Program Erase Conditions

| Program Erase, Disturb – Comment | Cell # | Vcg Poly 2 Row | V N- well Col. | V p- subst. | V p+p+ Col. lines | Vfg initial | State under FN window during | Vfg after | Switch xtor. state – final |
|---|---|---|---|---|---|---|---|---|---|
| • A) Block Prog. cells Erase to "OFF" | ALL | +18v all P2 | 0 a N-wells | 0 all | 0 all | 7.5 | 0v | -0.5 | off |
| (See Fig. 2A -->) | 30A-30I | 51, 52, 53 | 41, 42, 43 | 40 | 71a,b -> 73a,b | -0.5 | 0v | -0.5 | off |
| | | | | | | | | | |
| •B) Selective Cell Program to "ON" | 30E | 0 | 18 | 0 | 18 | -0.5 | 18v (Inversion) | 7.5 | on |
| (See Fig. 2A -->) | | 52 | 42 | 40 | 72a, 72b | 7.5 | 18v (Inversion) | 7.5 | on |
| | | | | | | | | | |
| Disturb Check - Sel. row, un-sel col. | 30D,F | 0 | 18 | 0 | 0 | -0.5 | Depletion, no dist. | -0.5 | off |
| (See Fig. 2A -->) | | 52 | 41, 43 | 40 | 71a,b + 73a,b | 7.5 | Depletion, no dist. | 7.5 | on |
| | | | | | | | | | |
| Disturb Check - Sel col, un-sel row. | 30B,H | 18 51, 53 | 18 42 | 0 40 | 18 72a, 72b | -0.5 | Near FG equipotential no dist. | -0.5 | off |
| (See Fig. 2A -->) | | 18 | 18 | 0 | 18 | 7.5 | Near FG equipotential No I fn, no dist. | 7.5 | on |
| | | | | | | | | | |
| Disturb Check-Un-sel, un-sel col. | 30A,C,G,I | 18 | 18 | 0 | 0 | -0.5 | Near FG equipotential +Depletion, no dist. | -0.5 | off |
| (See Fig. 2A -->) | | 18 51, 53 | 18 41, 43 | 40 | 71a,b + 73a,b | 7.5 | Near FG equipotential +Depletion, no dist. | 7.5 | on |

*FG = Floating Gate

NONVOLATILE REPROGRAMMABLE INTERCONNECT CELL WITH FN TUNNELING AND PROGRAMMING METHOD THEREOF

BACKGROUND OF THE INVENTION

The present invention is related to field programmable integrated circuits, especially Field Programmable Gate Arrays (FPGAs), and more particularly, to floating gate MOS transistors used as switching elements in an FPGA.

Typically, an FPGA has an array of logic elements and wiring interconnections with thousands, or even tens of thousands, of programmable interconnects so that the FPGA can be configured by the user into an integrated circuit with defined functions. Each programmable interconnect, or switch, can connect two circuit nodes in the integrated circuit to make (or break) a wiring interconnection or to set the function or functions of a logic element.

FPGAs use either memory cells or antifuses for the programmable interconnect. Memory cells are reprogrammable and antifuses are programmable only once. A new memory-type of programmable interconnect is disclosed in a patent application, U.S. patent application Ser. No. 08/270,714, entitled, "A GENERAL PURPOSE, NON-VOLATILE REPROGRAMMABLE SWITCH," filed Jul. 5, 1994 by Robert J. Lipp, Richard D. Freeman, Robert U. Broze, John M. Caywood, and Joseph G. Nolan, III, and assigned to the present assignee. In the FPGA described in the patent application, a non-volatile reprogrammable transistor memory (NVM) cell is used to provide a general purpose switching element to randomly interconnect FPGA wiring and circuit elements. Basically an NVM cell has an MOS transistor with a floating gate which may be charged and/or discharged. Charging and/or discharging the floating gate provides for the non-volatile programmability feature of NVM technologies.

In an FPGA, indeed, in any integrated circuit, it is important that the elements of the FPGA be as compact as possible for an efficient layout of the circuit and be as easily manufactured as possible. The present invention is directed toward highly compact cells of one of the programmable interconnects described in the patent application above. An efficient array of such interconnects, each of which is selectively programmable, is achieved. The manufacture of the interconnect cell array is straightforward in terms of present day semiconductor manufacturing technology.

SUMMARY OF THE INVENTION

The present invention provides for an integrated circuit having a plurality of circuit nodes and an array of programmable interconnect cells, each programmable interconnect cell capable of connecting the circuit nodes responsive to a programmed state of the interconnect cell. Each programmable interconnect cell has a first MOS transistor having first and second source/drains connected to first and second circuit nodes respectively, and a floating gate for turning the first MOS transistor off and on responsive to the amount of charge on the gate. The cell also has a tunneling device with one terminal connected to the floating gate of the first MOS transistor and coupled to a programming/erase line through a tunneling oxide layer, a control gate capacitively coupled to the floating gate, and at least one tunneling control line for controllably inhibiting tunneling through the oxide layer. The tunneling control line and the programming/erase line form a PN junction which is close to, but laterally displaced from, the region below the tunneling oxide layer. Under a reverse bias, the charge depletion region of the junction extends through the region below the tunneling oxide to block tunneling. This permits each programmable interconnect to be selectively programmable.

To program a selected programmable interconnect cell in an array of such cells, a voltage is generated between the region below the oxide layer and the floating gate of the selected cell. The voltage is sufficiently large so that electrons tunnel through the oxide layer from the floating gate to the region to set the floating gate into a programmed state. At the same time the non-selected programmable interconnect cells are protected from programming or programming disturbs by one of the following:

(a) A charge depletion region is formed in the substrate regions directly under the tunneling oxide layer by reverse biasing the PN junction between the tunneling control line and the program/erase line.

(b) An equipotential or low near-equipotential field is formed across the tunneling oxide layer such that the Fowler-Nordheim tunneling current is so low as to have a negligible disturb on the floating gate potential.

DETAILED DESCRIPTION OF PREFERRED EMBODIMENTS

Figure 1:
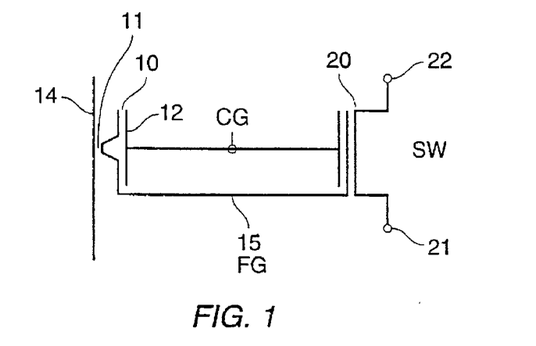
FIG. 1 is a circuit diagram of the programmable interconnects with a Fowler-Nordheim tunneling device for programming the interconnect.

FIG. 1 is a circuit diagram of the programmable interconnect discussed in the previously-noted patent application, which incorporates the programming means of this invention. The programmable interconnect has two parts, an MOS transistor 20 and a Fowler-Nordheim (FN) tunneling device 10. The MOS transistor 20 is a switch which programmably connects its source/drain regions, each of which is connected to a circuit node in the FPGA integrated circuit, to define a desired circuit. The circuit nodes are represented by the terminals 21 and 22 in FIG. 1. The operation of the MOS switch transistor 20 is determined by the programming, i.e., the charging (adding electrons) or discharging (removing electrons) of the gate of the transistor 20. For this, the gate of the transistor 20 is connected to, indeed, is part of a floating gate structure 15 which closely couples the MOS switch transistor 20 to the tunneling device 10. Floating gate 15 is further capacitively coupled to a control gate 12.

The tunneling device 10 is coupled between the floating gate 15 and a programming/erase line 14. The tunneling device 10 is composed of a special dielectric layer 11, in the form of a tunneling oxide, which separates a portion of the floating gate 15 from the programming/erase line 14. The special dielectric layer 11, provides a barrier between the programming/erase line 14 and the floating gate 15 through which electrons can "tunnel" under certain conditions. In this manner, the programmable interconnect can be erased or programmed by charging or discharging the floating gate to turn the MOS switch transistor 20 off or on, respectively.

To charge the floating gate 15, a voltage is placed between the control gate 12 and the programming/erase line 14. The voltage is large enough to permit the charges to tunnel through the dielectric layer 11. In the description below, electrons are used to charge and discharge the floating gate 15. Hence, to charge the programmable interconnect, a large positive voltage is placed on the control gate 12 with respect to the programming/erase line. This causes electrons to travel from the programming/erase line to the floating gate, which is capacitively coupled to the control gate 12. Conversely, to discharge the electrons from the floating gate 15 to the programming/erase line 14, the voltages are reversed on the programming/erase line 14 and control gate 12. The programmable interconnect is simple because only one device, the tunneling device 10, is used for both charging and discharging the floating gate.

Figure 2A:
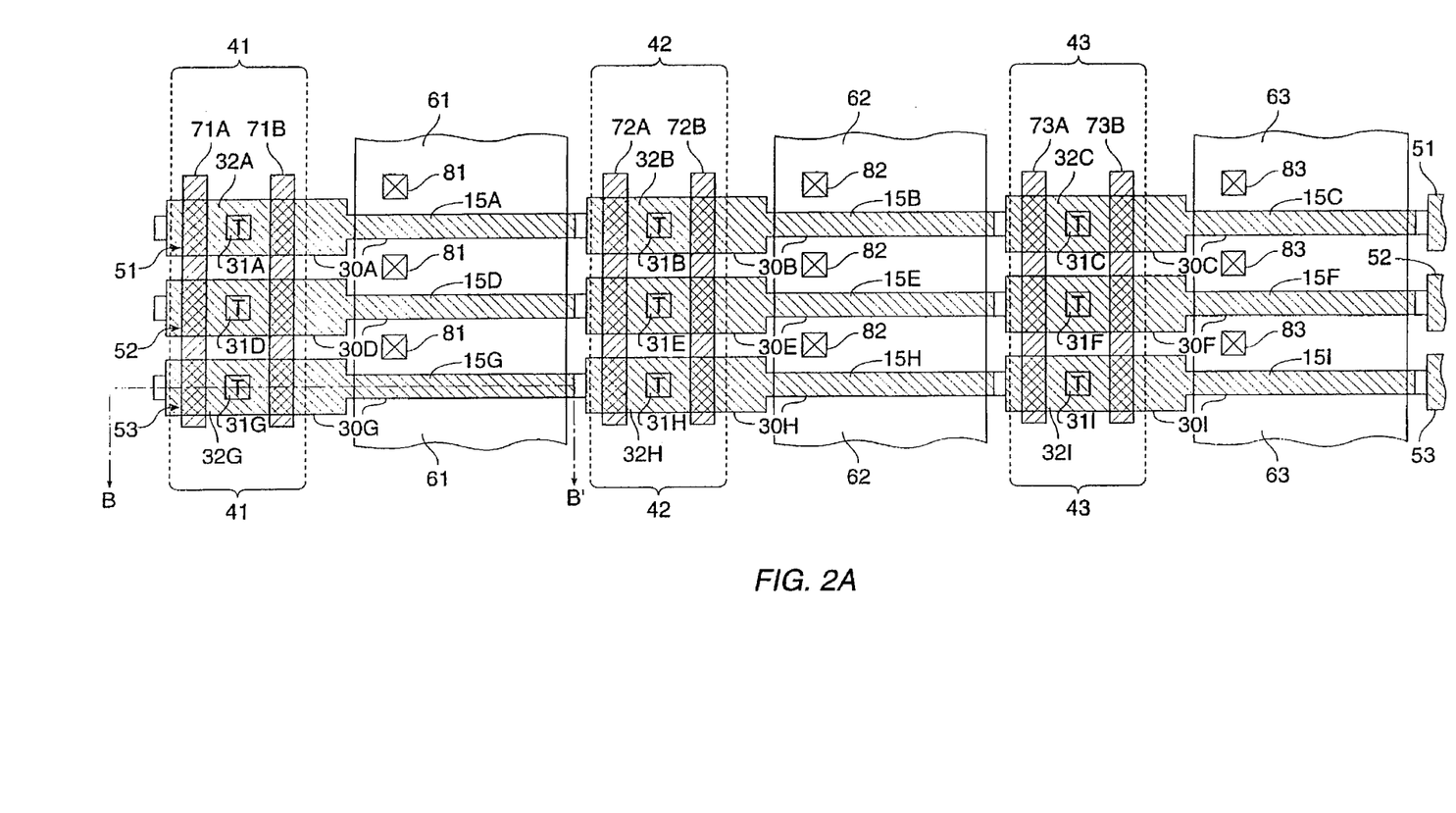
FIG. 2A is a plan view of an array of programmable interconnect cells with a Fowler-Nordheim tunneling devices according to one embodiment of the present invention.

FIG. 2A illustrates an array of programmable interconnect cells, each of which may be represented by the circuit diagram of FIG. 1, in rows and columns, according to the present invention. It should be noted that the words, "rows" and "columns," are used with respect to the drawings, but represent arbitrary directions for an integrated circuit. For exemplary purposes, the array in FIG. 2A is shown with only nine programmable interconnect cells 30A–30I. Polysilicon lines 51–53 run horizontally in the drawing and create rows in FIG. 2A array. The lines 51–53 form the control gates for the programmable interconnect cells. Specifically, the polysilicon line 51 forms the control gates for the programmable interconnect cells 30A–30C, the polysilicon line 52 forms the control gates for the cells 30D–30F, and the polysilicon line 53 the control gates for the cells 30G–30I. In semiconductor terminology, the lines 51–53 are formed from a "Poly 2" layer, since they are formed by the second polysilicon layer deposited over the substrate to form the integrated circuit.

Beneath the polysilicon lines 51–53 are polysilicon floating gate electrodes 15A–15I for each of the programmable interconnect cells 30A–30I. The sets of electrodes 15A–15C, 15D–15F, and 15G–15I are laterally coextensive with the overlying polysilicon control gate lines 51–53 respectively, except that each electrode is separated from other electrodes in the same row. The electrodes 15A–15I are indicated by the shading of diagonal lines in FIG. 2A. The electrodes 15A–15I are formed from a "Poly 1" layer, the first polysilicon layer deposited over the substrate 40.

Perpendicular to and beneath the lines 51–53 and electrodes 15A–15I, are programming/erase lines 41–43. The programming/erase lines 41–43 are delineated by dashed lines in FIG. 2A. These programming/erase lines 41–43 are N– well doped regions in the semiconductor substrate (shown in FIG. 2B) of the integrated circuit. These vertical lines 41–43 connect the programmable interconnect cells in a column. Separating the programming/erase lines 41–43 from the floating gate electrodes 15A–15I are silicon dioxide layers which have two thicknesses, namely a gate oxide 32A–32I, typically less than 400Å, and an especially thin region, i.e., less than 150Å, which forms the tunneling oxide 31A–31I for each cell. The tunneling oxide 31A–31I is represented by a box with the letter "T"; references numerals 31A–31I are used for the tunneling oxide in the respective cells. In the substrate on either side of, but within the dashed programming/erase lines (N– wells) 41–43 are heavily doped P+ regions, respectively. These P+ regions form tunneling control lines 71A,B–73A,B which prevent tunneling from a N– programming/erase line by forming a deep charge depletion region in the N– doped lines 41–43 between the lines 71A,B–73A,B. Only the cell above an N– programming/erase line with no reverse bias on the P+ tunneling control line, can be programmed, according to the present invention.

The MOS switch transistor of each cell 30A–30I comprises the right side of each floating gate electrode 15A–15I and the source/drain regions 61–63 in the semiconductor substrate. The source/drain regions 61–63 appear as vertical and continuous conducting regions in the substrate from the plan view of FIG. 2A. Of course, these N+ regions are separated by channel regions under the floating gate electrodes 15A–15I. These source/drain regions 61–63 lie in a P– substrate or a P– well which runs vertically and holds the source/drain regions 61–63 of the cells in a column. Each of the source/drain regions 61–63 are shown with via contacts 81–83, which are connected to the circuit nodes of the integrated circuit so that an MOS switch transistor can make (or break) a wiring interconnection or to set the function or functions of a logic element.

Figure 2B:
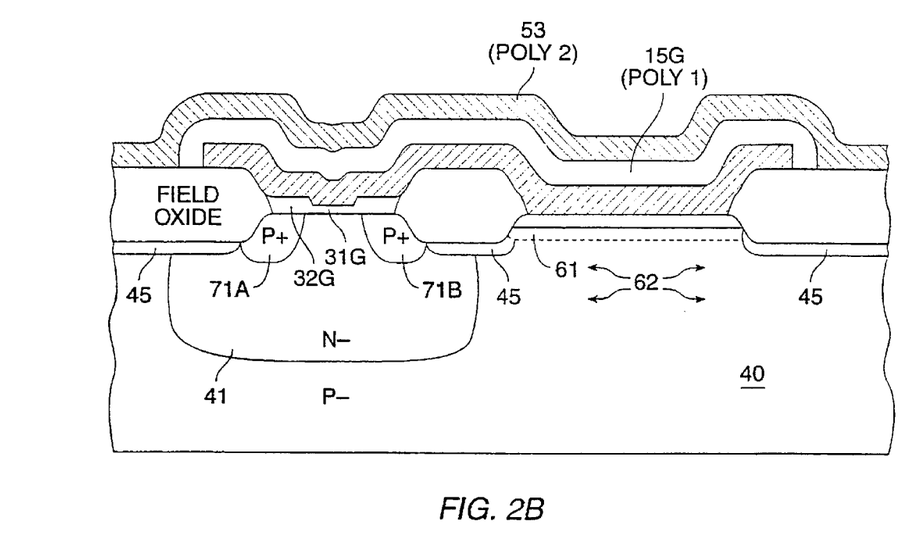
FIG. 2B is a cross-sectional view of one of the cells of FIG. 2A.

FIG. 2B is an exemplary cross-sectional view of the programmable interconnect cell 30G along line B—B' in FIG. 2A. As shown, the polysilicon line 53 forming the control gate extends across the programmable interconnect cell 30G. A silicon dioxide layer separates the floating gate electrode 15G from the MOS switch transistor channel region formed by the semiconductor substrate 40. On the left side of the floating gate electrode 15G, the silicon dioxide layer has the tunneling oxide layer 31G and the gate oxide layer 32G, which are located above the N– programming/erase line 41. On either side of the programming/erase line 41 are the P+ tunneling control lines 71A and 71B.

The right side of the floating gate electrode 15G forms the gate of the NMOS switch transistor of the programmable interconnect cell 30G. A P– substrate region 40 or a P– well underlies the channel region of the transistor. The source/drain regions 61 of the transistor are delineated by a dotted line because these regions are not part of the channel region, and hence do not lie along the line B—B' in FIG. 2A.

The silicon dioxide layer on the substrate 40 has varying thicknesses. In the region 32G over the tunnel device and the gate region of the MOS switch transistor of the programmable interconnect cell 30G, the layer is relatively thin, typically less than 500Å. In the other regions the dioxide layer thickens into a field oxide, typically between 5,000Å to 10,000Å. Beneath the field oxide are doped (in the present case, P+) channel-stop regions 45, as commonly found in present-day integrated circuits. Thus it should be evident that the drawings are not drawn to scale, but rather to explain out the various points of the present invention.

For programming the cells, the cells of the array shown in FIG. 2A are addressed by decoders which are responsive to address signals on input/output pins of the FPGA integrated circuit. During the programming of the cells, the decoders are connected to programming voltage supplies.

Figure 3:
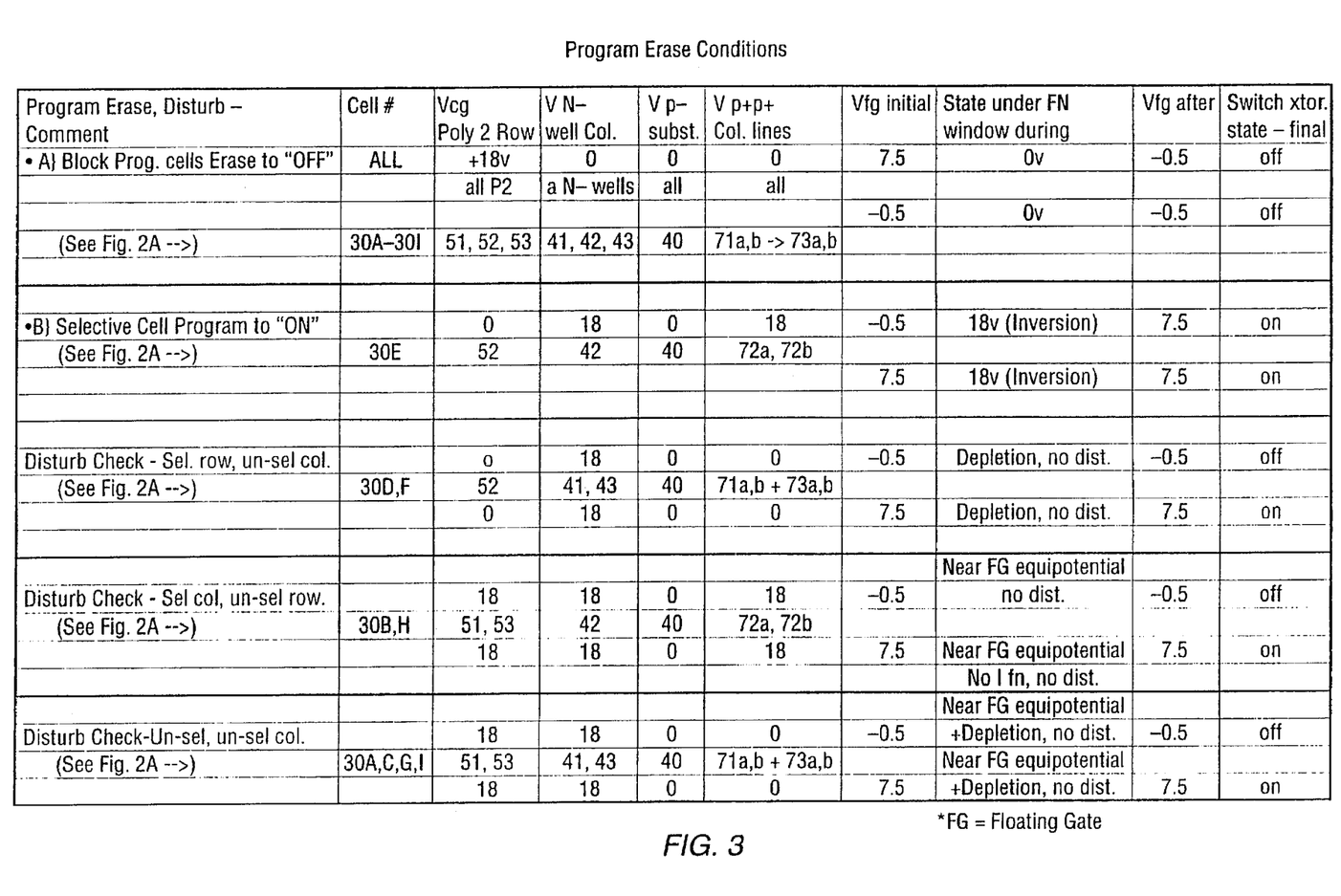
FIG. 3 is a exemplary table of programming voltages for the array of interconnects of FIG. 2A.

In the table of FIG. 3 each of the possible cell floating gate operating bias conditions (fully erased to $V_{fg}$=–0.5 volts / switch off, or fully programmed $V_{fg}$=7.5 volts /switch on) are listed. Operating bias conditions are achieved after erasing or programming the cell and then applying operating biases to the control gate and programming/erase lines so as to shift the erased/programmed states to the optimum operating conditions. Therefore, these erased/programming voltage levels are for illustrative purposes only and can be optimized for erase/programming and retention characteristics independently of operating conditions. For example, erased/programmed $V_{fg}$'s of +4/−4 volts can be used instead of −0.5/+7.5 volts.

In the operation of the array of programmable interconnect cells all floating gates of the cells in the array are initially charged (erased) in a block operation. That is, electrons are added to the floating gate electrodes 15A–15I of all the programmable interconnect cells in the array. This is done by raising the control gate lines 51–53 of all the rows of cells to a large positive voltage, 18 volts, and placing the programming/erase lines 41–43 and 71A,B–73A,B (tunneling control lines) of all the columns of cells to a ground, zero volts, in the case of the present embodiment. This causes the electrons on the respective floating gates 15A–15I to tunnel through the tunnel oxides 31A–31I to the floating gate electrodes 15A–15I. This lowers the voltage on all the floating gate electrodes 15A–15I of the array so that all of the NMOS switch transistors of the array are turned off. This operation is shown as the first operation (A) (Block Program Cells Erase to OFF) in the table in FIG. 3.

Then, the programmable interconnect cells are selectively discharged, i.e., programmed, to turn on the switch transistors of the selected cells. The selective discharging operation is performed by raising the N− column programming/erase line 41–43 and the P+ column tunneling control lines 71A,B–73A,B of the selected cell to +18 volts and maintaining the control gate line 51–53 of the selected cell at 0 volts. This creates an inversion layer biased to 18 volts on the surface of the programming/erase lines below the tunnel. In the rows of the unselected cells, the control gate lines 51–53 are left at +18 volts. In the columns of the unselected cells, the programming/erase lines 41–43 are left at +18 volts, and the tunneling control lines 71A,B–73A,B are kept at 0 volts. This creates a deep depletion region in the substrate below the tunneling oxide of the unselected cells since the N− programming/erase lines are biased positively and the P+ tunneling control lines are biased negatively with respect to the other. The light doping of the N− programming/erase lines ensures that the depletion region which is generated by the reverse bias is deep and spreads entirely across the region below the tunneling oxide. Blockage against tunneling electrons is now complete. Operation (B) (Selective Cell Program to "ON") in the FIG. 3 table illustrates the selective discharging of the cell 30E, as an example. The N− well column programming/erase line 42 and the tunneling control lines 72A, 72B are raised to +18 volts. The control gate row line 52 is set to 0 volts. The electrons on the floating gate 15E travel through the tunnel oxide 31E, to the N− well of the selected cell. The MOS switch transistor of the cell 30E is turned on since the charge on the floating gate 15E is reduced, and the floating gate voltage made more positive.

For the unselected cells with both unselected row and columns (30A, C, G, I), the control gate lines 51 and 53 are set to +18 volts and the programming/erase lines 41 and 43 are set to +18 volts also, while the tunneling control lines 71A,B and 73A,B of the unselected cells are set to 0 volts. These cells are not programmed due to the equipotential field between the control gate and programming/erase lines.

Similarly, the cells 30B and 30H with unselected rows and selected columns are not programmed because both the control gates 51 and 53 and N− well column programming/ erase line 42 line are both set to +18 volts.

Figure 4:
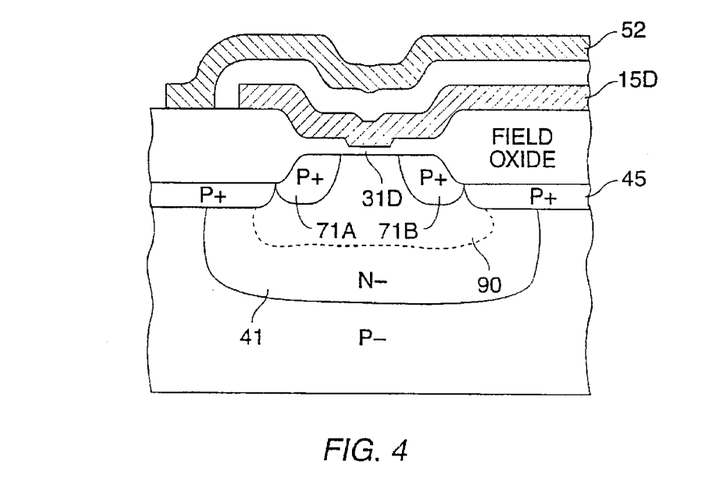
FIG. 4 illustrates a cross-sectional view of a charge depletion region in a tunneling device of a cell in the FIG. 2A array.

The cells 30D and 30F with selected rows and unselected columns are not programmed either. While the control gate line 52 of these cells is kept at 0 volts and the N− well column programming/erase lines 41 and 43 are set at +18 volts, the tunneling control lines 71A,B and 73A,B are set to 0 volts. For each of these cells, this creates a charge depletion region which extends under the tunneling oxide 31D and 31F due to the back-bias of the PN junction formed by the tunneling control lines 71A,B and 73A,B and the N− well column programming/erase lines 41 and 43 respectively. FIG. 4 shows the deep charge depletion region 90 illustrated by a dotted line and which extends under the tunnel oxide 31D. Because the voltage difference between the floating gate 15D or 15F and the N− well 41 or 43 is dropped almost entirely across the depletion region 90, and not the tunnel oxide 31D or 31F, charges are blocked from tunneling from the floating gate 15D or 15F to the N− well column programing/erase lines 41 or 43.

Charge depletion regions are also formed under the remaining cells 30A, 30C, 30G and 30I. No tunneling occurs in these cells either, due to the low field across the tunnel oxide. Most of the voltage drop between the floating gates (15A, 15C, 15G, 15I) and the N− well columns (41, 43) is across the depletion region 90.

In this manner, only the selected cell 30E is programmed.

Figure 5:
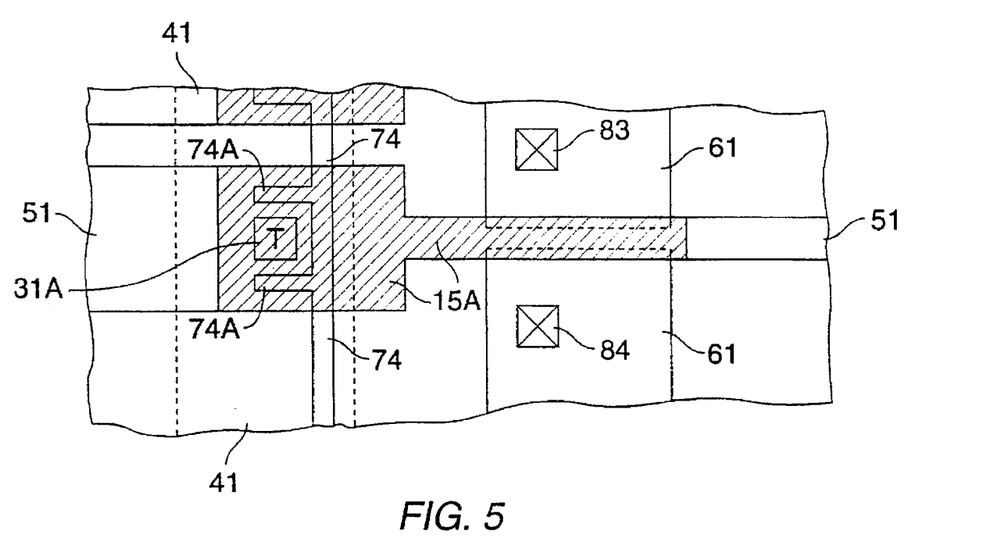
FIG. 5 is a plan view of a tunneling device for the programable interconnect according to another embodiment of the present invention.

FIG. 5 illustrates another embodiment of the programmable interconnect cell according to the present invention. In this embodiment, the same reference numbers are used for the exemplary cell 30A, except where the features are different. In this case, instead of a pair of tunneling control lines, a single line 74 is formed in the N− region forming the N− programming/erase line 41. The tunneling control line 74 runs parallel with the line 41 and has a pair of extensions 74A which extend perpendicularly from the line 74 on either side of the tunnel oxide 31A. The heavily doped P+ extensions 74A are located away from the region directly below the tunneling oxide so that the PN junction between the extensions 74A and the N− well programming/erase line 41 is removed from the region when the junction is unbiased. When the junction is reverse-biased, the charge depletion region of the junction extends across the region to prevent tunneling. In the same manner as described previously with respect to a pair of tunneling control lines, the extensions 74A form a deep charge depletion region under the tunnel oxide 31A when reverse-biased with the N− well programming/erase line 41.

Figure 6:
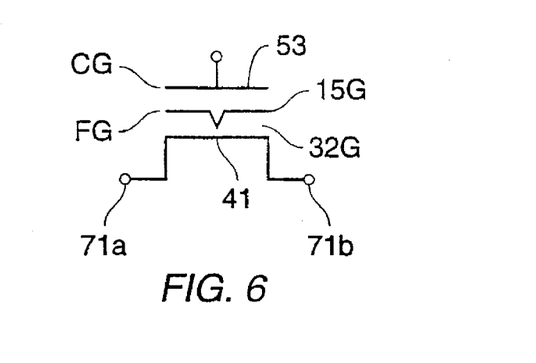
FIG. 6 is a circuit diagram of the Fowler-Nordheim tunneling device used in the mode to sense the FPGA cell state of programming.

As can be seen from FIGS. 2A and 2B, the Fowler-Nordheim section of the cell, e.g., cell 30G, may also be used as a P-MOS transistor (see FIG. 6). With proper biasing of rows 51–53, the P-MOS transistor 30G may be used to selectively monitor the programming state of each memory cell by monitoring the conductance of source/drain P+ column tunneling control lines 71A and 71B. An example of a method to measure the threshold and conductance of cell 30G would be as follows: bias rows 41 and 52, N− well 41, and control line 71A to 10 volts, and control line 71B to 0 volts; sweep the control gate voltage, row 53 from 0 volts to 15 volts and measure the current flowing from between control lines 71A and 71B. Threshold and conductance are then readily calculated.

Figure 7A:
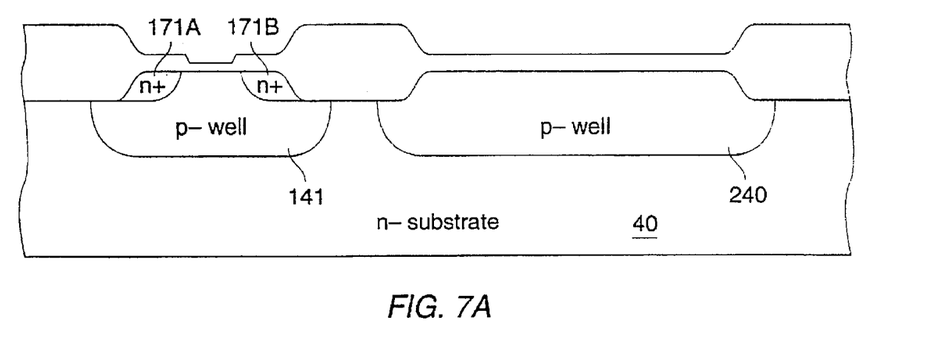
FIGS. 7A–7D are cross-sectional views of different process options to manufacture the programable interconnect cells of the present invention.
Figure 7B:
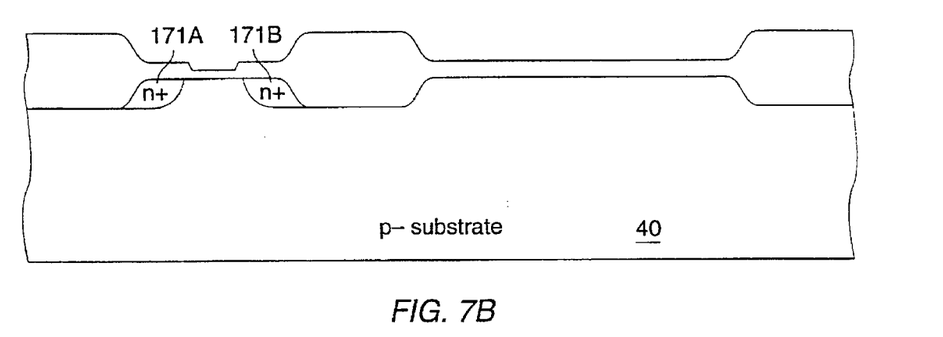
Figure 7C:
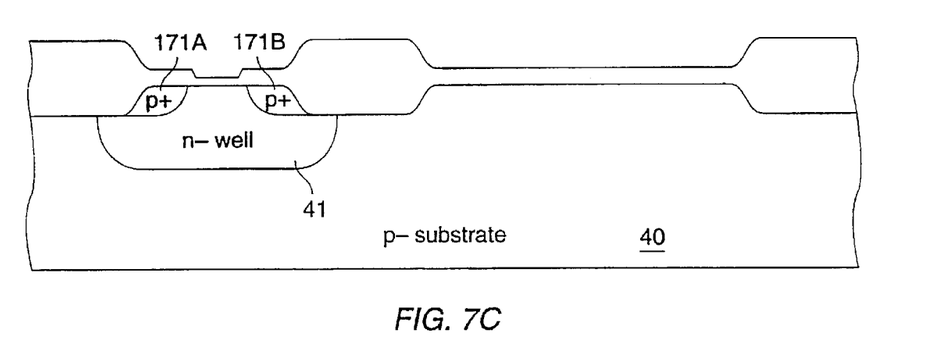

FIGS. 7A–7D show several different process options that may be used with same mask layout used in FIG. 2A. The preferred option used in this patent is illustrated in FIG. 7C. It can be seen this is the same as FIG. 2B.

Figure 7D:
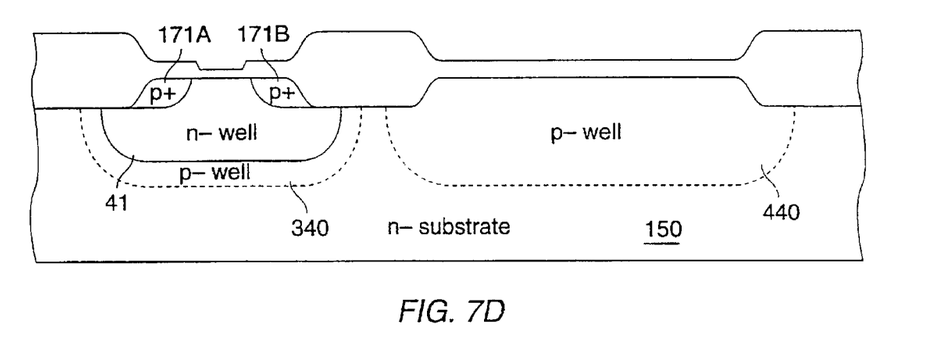

FIG. 7D illustrates a variation of FIG. 7C wherein a dual well process is employed to isolate the switch area 61 from the programing element, e.g., cell 30G of FIG. 2A, to increase the capacitive coupling to the floating gate 15G during erase. Normally, only a portion of the voltage placed on the control gates 51-53 is capacitively transferred to the floating gates 15A-15I due to the capacitive voltage division effects of parasitic capacitances to the floating gates, primarily the capacitance of the switch areas 61-63 under the control gates. Biasing the switch areas 61-63 the same as the control gates 51-53 assists the control gate in biasing the floating gates 15A-15I to the proper erase voltage level. This is accomplished during erase by biasing the programing/erase lines, N– wells 41-43, to –18 volts instead of 0 volts, placing 0 volts on the control gates 51-53 instead of 18 volts, and maintaining the P– well 440 under the switch area at 0 volts. N– substrate 150 is normally held at ground potential. A secondary advantage of this structure is that it permits an alternate method of operation, "splitting" the erase/programming voltages. For example, instead of applying +18/–18 volts biases to the various programing/ erase nodes with the control gates at 0 volts, +9/–9 volts may be applied to the programming/erase nodes while –9/+9 volts is applied to the control gates. This reduces the high voltage requirements on the process, thereby simplifying it.

The basic array operation is similar with all structures of FIGS. 7A-7D, except for the following exceptions:

| Structure | Comment |
| --- | --- |
| FIGS. 7A,B | Block erase all cells to "switch on" with poly 2 row control gates at 0 volts and HV on P– region under tunnel window. Selective cell program to "switch off" with appropriate control gate, column lines under floating gate, and programming/erase line bias. |
| FIG. 7C | Block erase all cells to "switch off" Poly 2 row control gate at 18 volts and 0 volts on N– region under tunnel oxide (described herein). Selective cell program to "switch on" (described herein). |
| FIG. 7D | Block erase by applying –18 volts to the programming/erase line 41 while holding all other nodes, including P– well 440 at 0 volts. P– well 340 may either be left floating or biased to the same voltage as erase line 41. |

Therefore, while the description above provides a full and complete disclosure of the preferred embodiments of the present invention, various modifications, alternate constructions and equivalents may be employed without departing from the true scope and spirit of the invention. In particular, all N and P-type materials may be replaced by their complements, P and N-type materials respectively, to create complementary structures which work identically to those described herein except with voltages of opposite polarity. The present invention, therefore, should be limited only by the metes and bounds of the appended claims.

What is claimed is:

1. In an integrated circuit having a plurality of circuit nodes and a plurality of programmable interconnects, each programmable interconnect capable of connecting said circuit nodes responsive to a programmed state, each programmable interconnect comprising a first MOS transistor having a first and second source/ drain connected to a first and second circuit node respectively, a floating gate and a control gate for turning said first MOS transistor off and on responsive to charge on said floating gate; and a tunneling device having a floating gate connected to said floating gate of said first MOS transistor and coupled to a programming/erase line through a tunneling oxide layer, a control gate capacitively coupled to said floating gate and to a floating gate of another tunneling device of another programmable interconnect, and means for controllably inhibiting tunneling through said oxide layer;

whereby said programmable interconnect is selectively programmable without programming said another programmable interconnect.

2. The programmable interconnect of claim 1 wherein said programming/erase line comprises a semiconductor region under said tunneling oxide layer, and wherein said tunneling inhibiting means comprises a charge depletion region in said semiconductor region controllably extending directly beneath said tunneling oxide.

3. The programmable interconnect of claim 2 wherein said tunneling inhibiting means comprises a PN junction under a reverse-bias to create a charge depletion region directly beneath said tunneling oxide.

4. The programmable interconnect of claim 3 wherein said PN junction under no bias is displaced from said semiconductor region.

5. The programmable interconnect of claim 4 wherein said PN junction under no bias is laterally displaced from said semiconductor region and is contiguous to said region on either side.

6. The programmable interconnect of claim 5 wherein said semiconductor region is of a first polarity, and said PN junction comprises two linearly-shaped regions of a second polarity in said region, said second polarity regions extending substantially parallel in either side of said first polarity semiconductor region.

7. The programmable interconnect of claim 6 wherein said two second polarity regions merge into a third linearly-shaped region of second polarity, said third region extending substantially perpendicular to said two second polarity regions.

8. The programmable interconnect of claim 6 wherein said semiconductor region comprises a first region in a semiconductor substrate, said first region having a low doping concentration.

9. The programmable interconnect of claim 8 wherein said two second polarity regions comprise second regions in said semiconductor substrate, said second regions having a high doping concentration.

10. The programmable interconnect of claim 8 wherein said first region comprises a P– region.

11. An array of programmable interconnect cells in an integrated circuit substrate, said array comprising each programmable interconnect cell having an MOS switch transistor having a pair of source/drain regions in said substrate separated by a floating gate electrode, said floating gate electrode extending over a tunneling oxide on said substrate spaced from and adjacent to the switch transistor and extending under a control gate electrode, said substrate having a first conducting region under said tunneling oxide adjacent to the switch transistor and a second conducting region contiguous to said first conducting region, said first and second conducting regions forming a PN junction in said substrate;

said programmable interconnect cells forming an array in rows and columns, programmable interconnect cells in a row having said control gate electrodes connected in common to a first line, programmable interconnect cells in a column having said first conducting regions connected in common to a second line and said second conducting regions connected in common to a third line;

whereby each programmable interconnect cell can be selectively programmed.

12. The array of programmable interconnect cells of claim 11 wherein said first conducting region comprises a lightly doped region of first polarity.

13. The array of programmable interconnect cells of claim 12 wherein said second conducting region comprises a heavily doped region of second polarity.

14. The array of programmable interconnect cells of claim 13 wherein said first conducting region comprises a P− region and said second conducting region comprises an N+ region.

15. The array of programmable interconnect cells of claim 14 wherein said pair of source/drain regions of said MOS switch transistor comprise N+ regions in a P− well region.

16. The array of programmable interconnect cells of claim 13 wherein said first conducting region comprises a N− region and said second conducting region comprises an P+ region.

17. The array of programmable interconnect cells of claim 16 wherein said pair of source/drain regions of said MOS switch transistor comprise P+ regions in a first N− well region and wherein said first and second conducting regions are located in a second N− well region.

18. The array of programmable interconnect cells of claim 11 wherein said second line comprises a first substantially linear, conducting region in said substrate joining said first conducting regions of programmable interconnect cells in a column.

19. The array of programmable interconnect cells of claim 11 wherein said third line comprises a second, substantially linear, conducting region in said substrate joining said second conducting regions of programmable interconnect cells in a column.

20. The array of programmable interconnect cells of claim 19 wherein said second line comprises a first substantially linear, conducting region in said substrate joining said first regions of programmable interconnect cells in a column, and said second, substantially linear, conducting region comprises a pair of third conducting regions aligned on either side of said first substantially linear, conducting region.

21. The array of programmable interconnect cells of claim 19 wherein said second line comprises a first substantially linear, conducting region in said substrate joining said first regions of programmable interconnect cells in a column, and said second, substantially linear, conducting region further comprises a pair of third conducting regions extending perpendicularly from said second, substantially linear, conducting region on either side of said first conducting region.

22. The array of programmable interconnect cells of claim 11 wherein said first line comprises a substantially linear, conducting layer over said substrate joining said control gate electrodes of programmable interconnect cells in a row.

23. In an integrated circuit on a semiconductor substrate, said integrated circuit having a plurality of circuit nodes and an array of programmable interconnect cells, each programmable interconnect cell having a floating gate over a region of said semiconductor substrate and capable of connecting a pair of said circuit nodes responsive to a programmed state of said floating gate, a method of programming a selected programmable interconnect cell comprising generating a voltage between said substrate region and said floating gate of said selected programmable interconnect cell sufficiently large so that electric charges tunnel through an oxide layer between said floating gate and said substrate region to set said floating gate into one state or another; and concurrently generating a charge depletion region in said substrate region of non-selected programmable interconnect cells;

whereby only said selected programmable interconnect cell in said array is programmed.

24. The method of claim 23 wherein said voltage generating step is such that said electric charges tunnel from said floating gate to said substrate region.

25. The method of claim 23 wherein said voltage generating step is such that said electric charges tunnel from said substrate region to said floating gate.

26. The method of claim 23 wherein said charge depletion region generating step comprises reverse biasing a PN junction near said substrate region so that said charge depletion region extends through said substrate region.

27. The method of claim 26 wherein said programmable interconnect cells are arrayed in rows and columns, said substrate region of each cell comprising a first region of first polarity and bordering a second region of second polarity, said first and second regions defining said PN junction, said first region of each cell in a column connected together, said second region of each cell in a column connected together, and wherein said charge depletion generating step comprises reverse biasing said PN junction of each cell in said column.

28. The method of claim 27 wherein said first region of each cell in a column connected together comprise a first line for said column and said second region of each cell in a column connected together comprise a second line for said column, said charge depletion generating step comprises generating a first voltage on said first line and generating a second voltage on said second line, said first and second voltages having a difference such that said PN junction of each cell in said column is reverse-biased.

29. The method of claim 28 wherein each programmable interconnect cell has a control gate electrode capacitively coupled to said floating gate of said cell, said control gate electrode of each cell in a row connected together, and wherein said voltage generating step between said substrate region and said floating gate comprises generating a third voltage on said control gate electrodes of each cell in a row of said selected cell, said third voltage having a difference with respect to said first voltage so that electric charges tunnel through an oxide layer of said selected cell.

30. The method of claim 23 wherein each cell further comprises a control gate electrode capacitively coupled to said floating gate of said cell, and said substrate region of each cell further comprises a first region of first polarity and bordering second and third regions of second polarity, said first and second regions, and first and third regions defining said PN junction, said method further comprising setting said first region of a preselected programmable interconnect cell to a first voltage;

generating a second voltage between said second and third regions of said preselected programmable interconnect cell; and generating a third voltage on said control gate of said preselected programmable interconnect cell so as to turn on said preselected programmable interconnect cell;

determining an amount of current between said second and third regions;

whereby the programmed state of said preselected programmable interconnect cell may be monitored.

* * * * *